United States Patent
Chen et al.

(10) Patent No.: US 11,991,867 B2
(45) Date of Patent: May 21, 2024

(54) CLOSED-LOOP LIQUID COOLING SYSTEM

(71) Applicant: Quanta Computer Inc., Taoyuan (TW)

(72) Inventors: Chao-Jung Chen, Taoyuan (TW);
Yu-Nien Huang, Taoyuan (TW);
Jen-Mao Chen, Taoyuan (TW);
Shao-Yu Chen, Taoyuan (TW)

(73) Assignee: QUANTA COMPUTER INC., Taoyuan (TW)

(*) Notice: Subject to any disclaimer, the term of this patent is extended or adjusted under 35 U.S.C. 154(b) by 97 days.

(21) Appl. No.: 17/445,239

(22) Filed: Aug. 17, 2021

(65) Prior Publication Data

US 2022/0377943 A1 Nov. 24, 2022

Related U.S. Application Data

(60) Provisional application No. 63/191,632, filed on May 21, 2021.

(51) Int. Cl.
*H05K 7/20* (2006.01)

(52) U.S. Cl.
CPC ..... *H05K 7/20781* (2013.01); *H05K 7/20254* (2013.01); *H05K 7/20272* (2013.01)

(58) Field of Classification Search
None
See application file for complete search history.

(56) References Cited

U.S. PATENT DOCUMENTS

| | | | | |
|---|---|---|---|---|
| 9,943,016 B2* | 4/2018 | Pietrantonio | ...... | H05K 7/20927 |
| 10,234,061 B2* | 3/2019 | Ellsworth, Jr. | ...... | G06F 1/20 |
| 10,980,154 B1* | 4/2021 | Gao | ...... | H05K 7/20781 |
| 2002/0002323 A1* | 1/2002 | Moriyama | ...... | A61B 1/0051 600/130 |
| 2004/0194298 A1* | 10/2004 | Sausner | ...... | H01R 4/183 29/825 |
| 2005/0099005 A1* | 5/2005 | Fullbeck | ...... | F16L 33/2073 285/903 |

(Continued)

FOREIGN PATENT DOCUMENTS

| | | |
|---|---|---|
| CN | 1320417 C | 6/2007 |
| CN | 106557133 A | 4/2017 |
| TW | I695973 B | 6/2020 |

OTHER PUBLICATIONS

TW Office Action for Application No. 111103038, dated Feb. 2, 2023, w/ First Office Action Summary.

*Primary Examiner* — Courtney L Smith
(74) *Attorney, Agent, or Firm* — NIXON PEABODY LLP

(57) ABSTRACT

A closed-loop liquid cooling system includes a liquid coolant conduit, a cold plate, a pump and a heat exchanger. The liquid coolant conduit is in proximity to a heat-generating electrical component. The liquid coolant conduit allows circulation of a liquid coolant to extract heat therefrom. The liquid coolant conduit includes an inner portion that surrounds and contains the liquid coolant, and an outer portion configured to prevent or inhibit leakage of the liquid coolant from the inner portion and also detect any leakage from the inner portion. The cold plate is in thermal communication with the liquid coolant. The pump is configured to transport the liquid coolant in the liquid coolant conduit. The heat exchanger is coupled to the liquid coolant conduit to extract heat therefrom.

14 Claims, 9 Drawing Sheets

(56) References Cited

U.S. PATENT DOCUMENTS

| | | | | |
|---|---|---|---|---|
| 2006/0187638 A1* | 8/2006 | Vinson | ............... | H05K 7/20009 |
| | | | | 361/698 |
| 2020/0404812 A1* | 12/2020 | Gao | ..................... | H05K 7/2079 |
| 2022/0196507 A1* | 6/2022 | Subrahmanyam | ...... | G01M 3/20 |
| 2022/0369520 A1* | 11/2022 | Heydari | ............. | H05K 7/20781 |

* cited by examiner

CLOSED-LOOP LIQUID COOLING SYSTEM

CROSS REFERENCE TO RELATED APPLICATION

This application claims priority to and the benefits of U.S. Provisional Patent No. 63/191,632 filed on May 21, 2021, titled "IT System Protect Device When Coolant Leakage Or Spray From Liquid Cooling Loop", the contents of which are hereby incorporated by reference herein in their entirety.

FIELD OF THE INVENTION

The present disclosure relates generally to a cooling system for information technology (IT) systems. More particularly, aspects of this disclosure relate to a cooling system that assists in preventing or inhibiting leakage and also for detecting leakage.

BACKGROUND OF THE INVENTION

Computer components, such as servers, include numerous electronic components that are powered by a common power supply. Servers generate an enormous amount of heat due to the operation of internal electronic devices such as controllers, processors, memory, and the like. Overheating from the inefficient removal of such heat has the potential to shut down or impede the operation of such devices. Due to the improvement of high-performance systems, the amount of heat that needs to be removed becomes higher with each new generation of electronic components. With the advent of more powerful components, traditional air cooling in combination with fan systems is inadequate to sufficiently remove heat generated by newer generation components.

Liquid cooling is the currently accepted solution for rapid heat removal due to the superior thermal performance from liquid cooling. Liquid cooling is more effective in absorbing and transporting heat from the heat-generating components, and allows heat removal without noise pollution. One problem with using liquid cooling systems is preventing or inhibiting leakage and detection of the same so that the information technology system is not damaged. In addition to leakage, the liquid cooling systems can also cause liquid spray that damages the information technology system.

Thus, there is a need for a liquid cooling system that overcomes such problems.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to one aspect of the present disclosure, a closed-loop liquid cooling system comprises a liquid coolant conduit, at least one cold plate, at least one pump and at least one heat exchanger. The liquid coolant conduit is in proximity to a heat-generating electrical component. The liquid coolant conduit allows circulation of a liquid coolant to extract heat from the heat-generating electrical component. The liquid coolant conduit includes an inner portion that surrounds and contains the liquid coolant. The liquid coolant conduit includes an outer portion configured to prevent or inhibit leakage of the liquid coolant from the inner portion and also detect any leakage from the inner portion. The at least one cold plate is in thermal communication with the liquid coolant. The at least one pump is configured to transport the liquid coolant in the liquid coolant conduit. The at least one heat exchanger is coupled to the liquid coolant conduit to extract heat therefrom.

According to a configuration of the above implementation, the at least one cold plate is a plurality of cold plates.

According to another configuration of the above implementation, the inner portion of the liquid coolant conduit is a metal tube. In another implementation, the outer portion of the liquid coolant conduit includes a liquid detect sensor and a leakage/spray prevention shell. In one embodiment, the liquid detect sensor is located between the inner portion and the leakage/spray prevention shell.

In a further implementation, the leakage/spray prevention shell includes polyvinyl chloride (PVC), polyethylene terephthalate (PET), ethylene propylene diene monomer (EPDM), or any combination thereof.

In yet another implementation, the liquid detect sensor is braided. In one embodiment, the liquid detect sensor includes an external braided component and a plurality of internal braided components. Each of the plurality of internal braided components includes and surrounds an electrode located therein.

In one implementation, a rack manifold to assist in distributing the liquid coolant is further included.

In a further implementation, the at least one pump and the at least one heat exchanger are located within a coolant distribution unit.

In a further aspect of the above implementation, the coolant distribution unit further includes an air flow system operable to propel ambient air through the at least one heat exchanger.

In yet another implementation, the liquid coolant conduit is coupled to the at least one cold plate.

In one implementation, liquid coolant is further included.

According to another aspect of the present disclosure, a computer system comprises a plurality of heat-generating electrical components, a liquid coolant conduit, at least one cold plate, at least one pump and at least one heat exchanger. The liquid coolant conduit is in proximity to the plurality of heat-generating electrical components allowing circulation of a liquid coolant to extract heat from the plurality of heat-generating electrical components. The liquid coolant conduit includes an inner portion that surrounds and contains the liquid coolant, and an outer portion configured to prevent or inhibit leakage of the liquid coolant from the inner portion and also to detect any leakage from the inner portion. The at least one cold plate is in thermal communication with the liquid coolant. The at least one pump is configured to transport the liquid coolant in the liquid coolant conduit. The at least one heat exchanger is coupled to the liquid coolant conduit to extract heat therefrom.

In a further aspect of the above implementation, the plurality of heat-generating electrical components is a plurality of servers.

In a further implementation, the outer portion of the liquid coolant conduit includes a liquid detect sensor and a leakage/spray prevention shell. In one embodiment, the liquid detect sensor is located between the inner portion and the leakage/spray prevention shell.

In yet another implementation, the leakage/spray prevention shell includes polyvinyl chloride (PVC), polyethylene terephthalate (PET), ethylene propylene diene monomer (EPDM), or any combination thereof.

In yet another implementation, the liquid detect sensor includes an external braided component and a plurality of internal braided components. Each of the plurality of internal braided components includes and surrounds an electrode located therein.

In yet another implementation, a rack manifold to assist in distributing the liquid coolant is further included.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1:
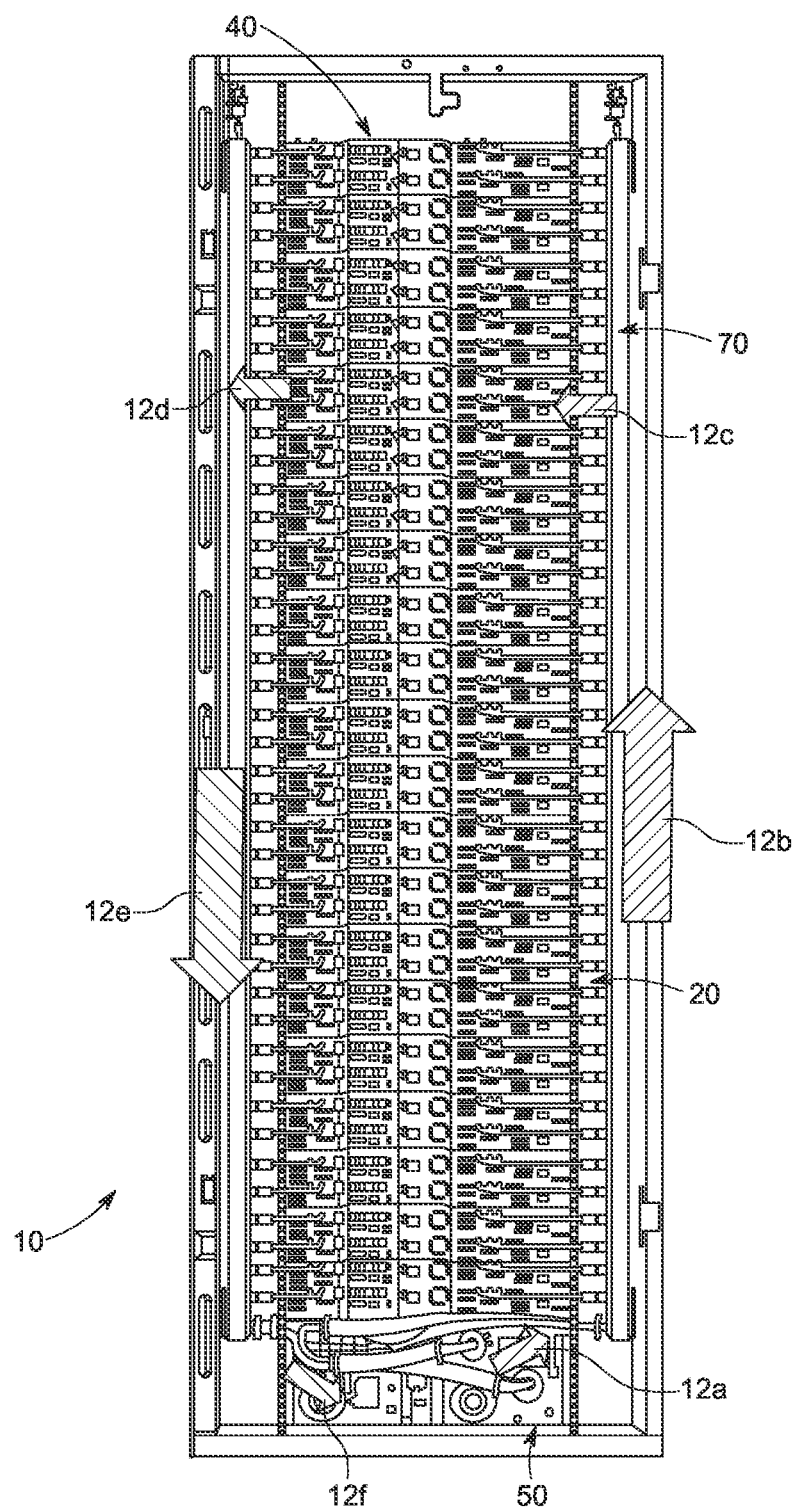
FIG. 1 is a front view of a closed-loop liquid cooling system, according to one embodiment of the present disclosure.

According to one aspect of the present disclosure, a closed-loop liquid cooling system comprises a liquid coolant conduit, at least one cold plate, at least one pump and at least one heat exchanger. The liquid coolant conduit is in proximity to a heat-generating electrical component allowing circulation of a liquid coolant to extract heat from the heat-generating electrical component. The liquid coolant conduit includes an inner portion that surrounds and contains the liquid coolant and an outer portion configured to prevent or inhibit leakage of the liquid coolant from the inner portion and also to detect any leakage from the inner portion. The at least one cold plate is in thermal communication with the liquid coolant. The at least one pump is configured to transport the liquid coolant in the liquid coolant conduit. The at least one heat exchanger is coupled to the liquid coolant conduit to extract heat therefrom.

The closed-loop liquid cooling system is configured to protect information technology (IT) systems. Non-limiting examples of information technology (IT) systems include, but are not limited to, servers, computer systems, network switches, stand-alone computers, or storage units (e.g., just a bunch of disks (JBOD)). In one embodiment, a server includes memory, a processor, a cooling fan, a power supply, heat syncs, and a chassis.

Non-limiting examples of heat-generating components include, but are not limited to, storage servers, application servers, switches, and other electronic devices. Examples include, but are not limited to, central processing units (CPU), dual in-line memory modules (DIMM), network cards, hard disk drives (HDD), solid state drives (SSD), graphics processing units (GPU) or field programmable gate arrays (FPGA). It is contemplated that other heat-generating components may be cooled by the closed-loop liquid cooling system of the present application.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including"

means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Referring to FIG. 1, a front view of a closed-loop liquid cooling system 10 is shown. The closed-loop liquid cooling system 10 includes a liquid coolant conduit 20, a plurality of heat-generating electrical components 40, a coolant distribution unit (CDU) 50, and a rack manifold 70. The closed-loop liquid cooling system 10 uses heat exchange to cool hot water, which is heated from the heat source (the plurality of heat-generating electrical components 40). Liquid coolant 90 (see FIGS. 5A, 5B) is contained within the liquid coolant conduit 20 and is circulated to extract heat from the plurality of heat-generating electrical components 40. Referring back to FIG. 1, the liquid coolant conduit 20 is located in proximity to the plurality of heat-generating electrical components 40.

The liquid coolant conduit 20 carries the liquid coolant 90 to the plurality of heat-generating electrical components 40. Heat generated by the plurality of heat-generating electrical components 40 is transferred to the liquid coolant 90. The liquid coolant conduit 20 carries the liquid coolant 90 (heated) away from the plurality of heat-generating electrical components 40. The path of the liquid coolant 90 (FIGS. 5A, 5B) in the liquid coolant conduit 20 is shown generally in FIG. 1 with arrows 12a-12f. The arrow 12a shows the liquid coolant 90 (cooled) immediately after leaving the coolant distribution unit 50. The arrow 12b shows the liquid coolant 90 (which is still cooled) being distributed in the rack manifold 70 after leaving the coolant distribution unit 50. The arrows 12c, 12d show the path of the liquid coolant 90 before and after being heated by the plurality of heat-generating electrical components 40. The arrow 12e shows the path of the liquid coolant 90 (heated) returning to the rack manifold 70, while the arrow 12f shows the liquid coolant 90 (heated) immediately before returning to the coolant distribution unit 50.

In this embodiment, the plurality of heat-generating electrical components 40 is servers. Non-limiting examples of heat-generating components that may be cooled by the closed-loop liquid cooling system include, but are not limited to, storage servers, application servers, switches, or other electronic devices. Examples include, but are not limited to, CPU, DIMM, network card, a HDD, SSD, GPU, or FPGA.

Figure 2A:
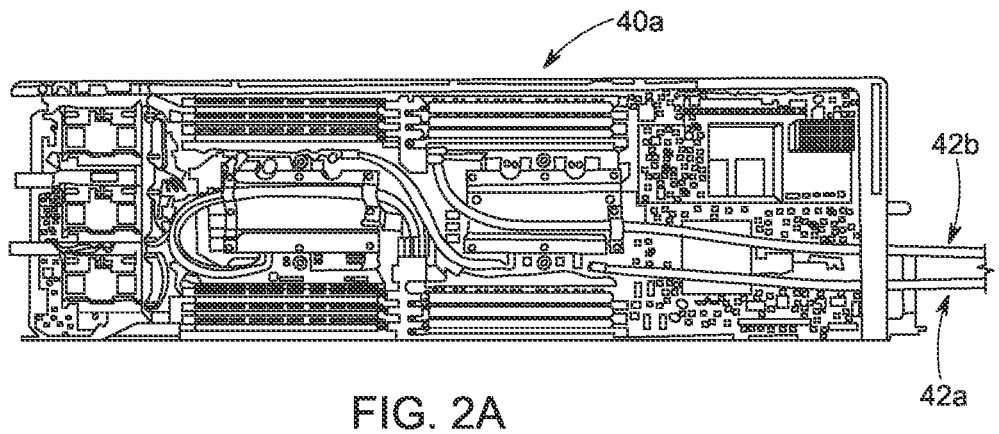
FIG. 2A is an enlarged front view of one of the servers in the closed-loop liquid cooling system of FIG. 1.

In FIG. 1, the plurality of heat-generating electrical components 40 is servers. A more detailed view of one of the servers is shown in FIG. 2A with a heat-generating electrical component 40 (i.e., server 40a). The server 40a includes a liquid coolant conduit portion 42a that brings in the liquid coolant 90 (cooled) (see FIGS. 5A, 5B), and a liquid coolant conduit portion 42b that removes the liquid coolant 90 (heated). The server 40a may include a plurality of fans to assist in cooling. The plurality of fans may be located in the server or adjacent to the server.

Figure 2B:
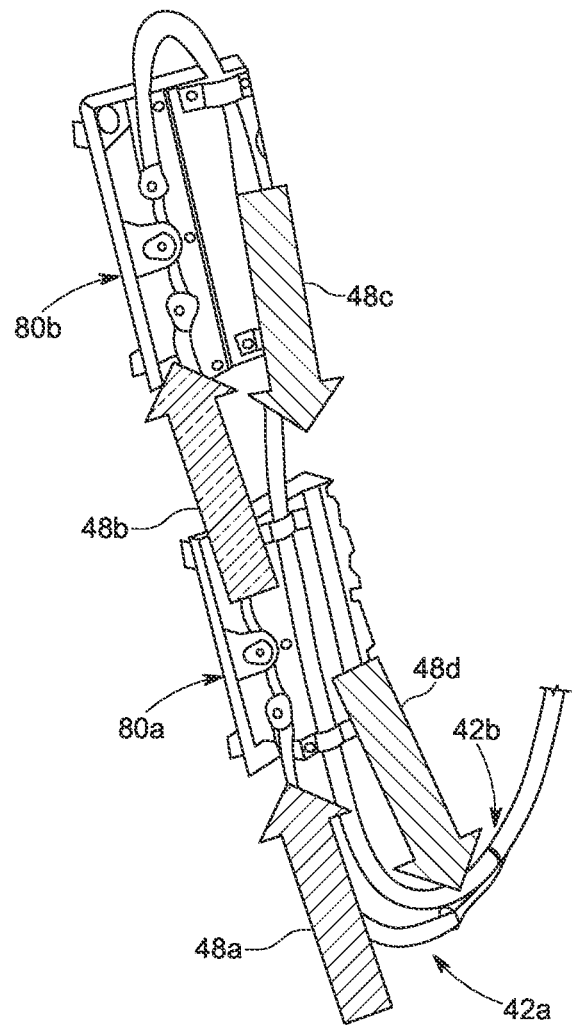
FIG. 2B is a schematic depicting the flow of liquid coolant from cold to warm in a portion of the closed-loop liquid cooling system of FIG. 1.

FIG. 2B shows the flow of the liquid coolant 90 in a portion of the liquid coolant conduit 20 that absorbs heat from the plurality of heat-generating electrical components 40 via cold plates 80a, 80b. This flow is depicted with the assistance of arrows 48a-48d. The arrow 48a shows the path of the liquid coolant 90 (cooled) before absorbing heat from the plurality of heat-generating electrical components 40. As the liquid coolant 90 proceeds on its path (arrows 48b-48d), the liquid coolant 90 continues to absorb heat from the plurality of heat-generating electrical components before eventually exiting back to the coolant distribution unit 50 (FIG. 1).

Figure 3:
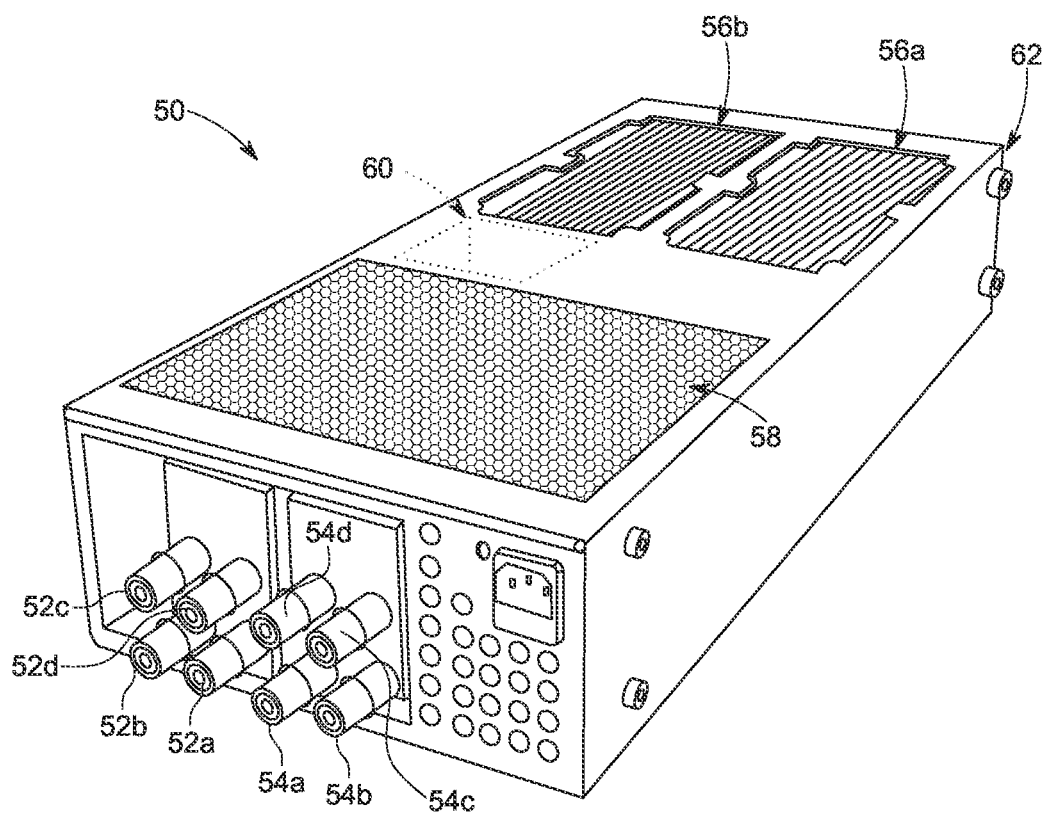
FIG. 3 is an enlarged front perspective view of a coolant distribution unit (CDU) in the closed-loop liquid cooling system of FIG. 1.

Referring to FIG. 3, the coolant distribution unit (CDU) 50 includes a plurality of connectors 52a-52d that assist with removing the liquid coolant 90 (cooled) (FIGS. 5A, 5B) and a plurality of connectors 54a-54d that assist with receiving the liquid coolant 90 (heated). The coolant distribution unit (CDU) 50 includes at least one pump 56a, 56b configured to transport the liquid coolant 90 in the liquid coolant conduit 20, a heat exchanger 58 coupled to the liquid coolant conduit 20 to extract heat therefrom, and a control system 60 that assists in controlling the process of the closed-loop liquid cooling system 10. The coolant distribution unit 50 typically includes an air flow system 62 operable to propel ambient air through the heat exchanger 58.

In one embodiment, the heat exchanger 58 is fluidly coupled to the liquid coolant conduit 20 to extract heat therefrom. The heat exchanger also typically includes a manifold and a plurality of tubes (not shown), which assist in efficient cooling of the liquid coolant 90 (heated). There may be exactly one heat exchanger or a plurality of heat exchangers.

It is contemplated that the components of the coolant distribution unit (CDU) 50 may be placed in separate locations within the closed-loop liquid cooling system. For example, a pump may not be located within the housing of the coolant distribution unit in another embodiment.

Figure 4:
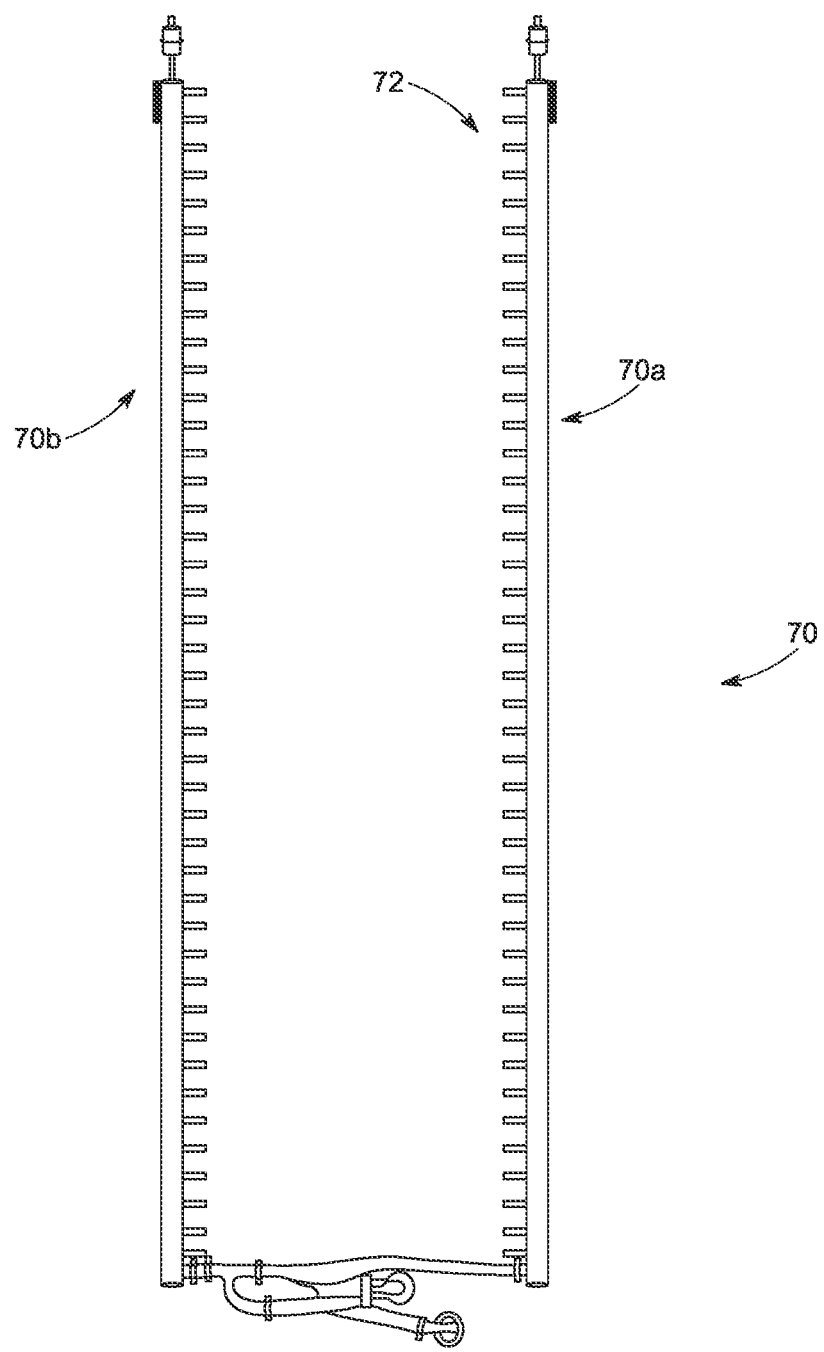
FIG. 4 is an enlarged inner side view of a rack manifold in the closed-loop liquid cooling system of FIG. 1.

Referring to FIG. 4, an enlarged inner side view of the rack manifold 70 is shown. The rack manifold 70 distributes or manages liquid distribution between the coolant distribution unit 50 (see FIG. 1) and a passive cold plate 80c, which will be discussed below in context with FIG. 6. The rack manifold 70 has a first side 70a for distributing the liquid coolant 90 (cooled) and a second side 70b for collecting the liquid coolant 90 (heated).

The rack manifold 70 is typically made of a metallic material, such as stainless steel. It is contemplated that other metallic material or non-metallic material may be used in forming the rack manifold. Referring to FIGS. 4 and 5A-5C, the rack manifold 70 typically includes a plurality of connectors 72. These plurality of connectors 72 are desirable configured to quickly remove or swap the plurality of heat-generating electrical components. The plurality of connectors 72 are also typically made of metallic material, such as stainless steel.

Figure 5A:
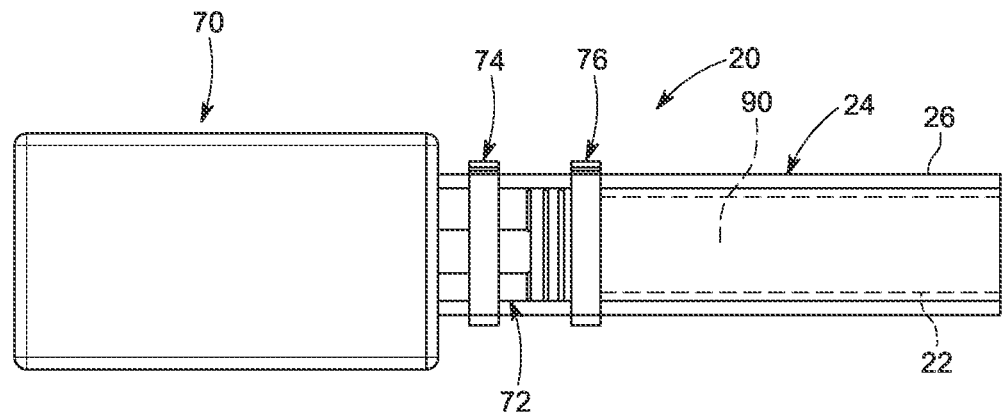
FIG. 5A is a top view of the rack manifold of FIG. 4 and a portion of the liquid coolant conduit extending therefrom in accordance with one embodiment.
Figure 5B:
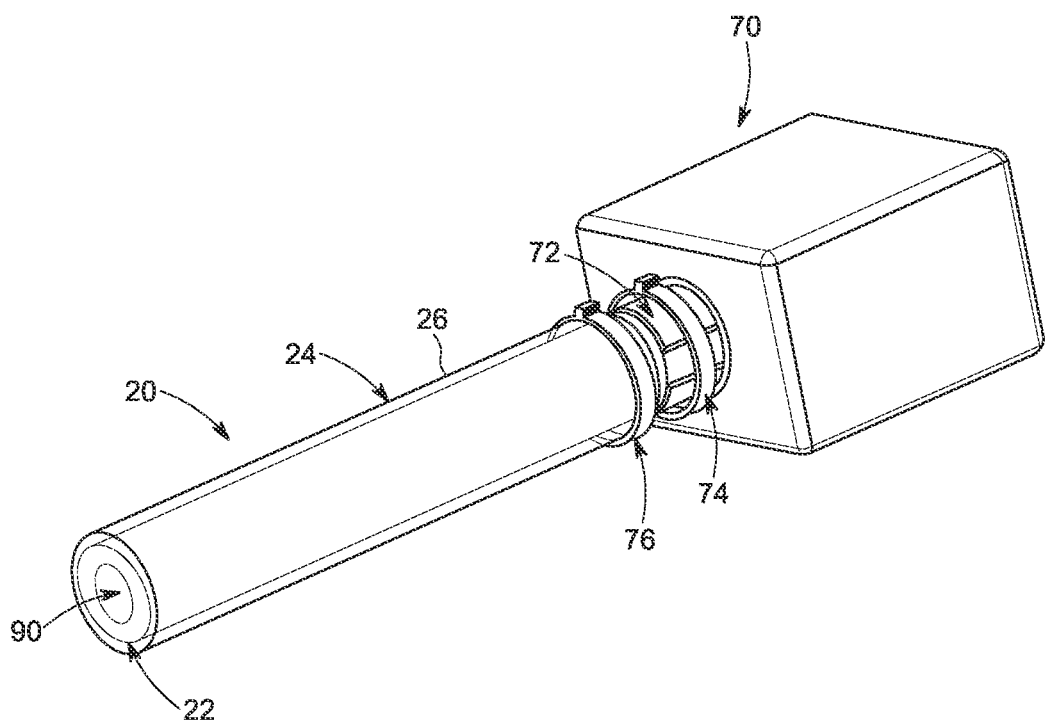
FIG. 5B is an isometric view of a portion of the rack manifold of FIG. 4 and the liquid coolant conduit of FIG. 5A.
Figure 5C:
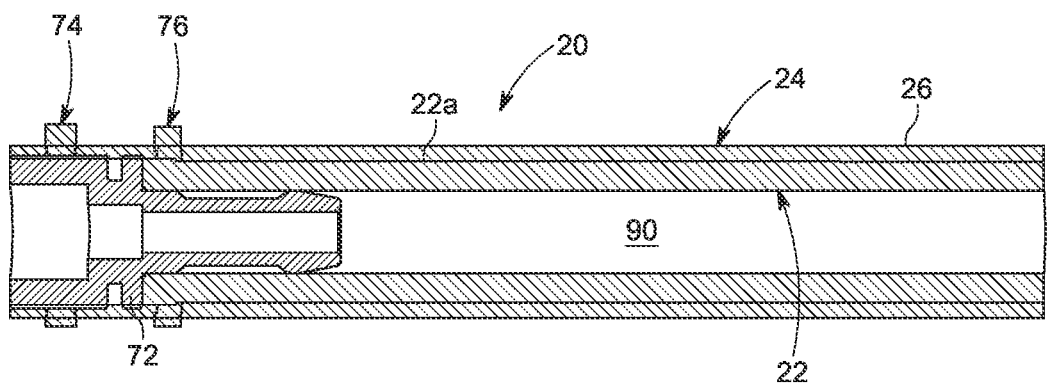
FIG. 5C is a generally cross-sectional view of a portion of the liquid coolant conduit of FIG. 5A.

Referring to FIGS. 5A-5C, the connection between the rack manifold 70 and the liquid coolant conduit 20 is shown. The rack manifold 70 is connected to the liquid coolant conduit 20 via one of the plurality of connectors 72 (shown best in FIG. 5C), a clamp 74 and an ear hose clamp 76. The clamp 74 and the ear hose clamp 76 assist in maintaining the positioning of the rack manifold 70 and the liquid coolant conduit 20.

Referring specifically to FIG. 5C, the liquid coolant conduit 20 includes an inner portion 22 that surrounds and contains the liquid coolant 90 (FIG. 5A). The liquid coolant conduit 20 further includes an outer portion 24 is configured to prevent or inhibit leakage of the liquid coolant 90 from the inner portion 22 and also to detect any leakage from the inner portion 22. The inner portion 22 in one embodiment is a metal tube or pipe. One non-limiting metal that may be used in forming the inner portion 22 is stainless steel and cold-rolled steel such as SGCC steel. One non-limiting polymeric material that may be used in forming the inner portion is ethylene propylene monomer (EPDM). It is contemplated that other materials may be used in forming the inner portion.

The outer portion of the liquid coolant conduit includes a liquid detect sensor and a leakage/spray prevention shell. More specifically, the outer portion 24 includes a leakage/spray prevention shell 26 and a liquid detect sensor 28. The leakage/spray prevention shell 26 prevents or inhibits leakage of the liquid coolant 90 from the inner portion 22. The leakage/spray prevention shell 26, as shown best in FIG. 5C, surrounds an exterior surface 22a of the inner portion 22. The clamp 74 and the ear hose clamp 76 are adjacent to and contact the leakage/spray prevention shell 26. If there is a leak or spray of the liquid coolant 90 from the inner portion 22, then the liquid coolant 90 desirably remains within the leakage/spray prevention shell 26.

The outer portion 24 may be shrunk wrapped to the inner portion 22 in one embodiment. It is also contemplated that other methods may be used in locating the outer portion and the inner portion of the liquid coolant conduit with respect to each other. The outer portion 24 in one embodiment includes polyvinyl chloride (PVC), polyethylene terephthalate (PET), ethylene propylene diene monomer (EPDM), or any combination thereof. It is contemplated that other materials may be used in forming the outer portion.

Figure 6:
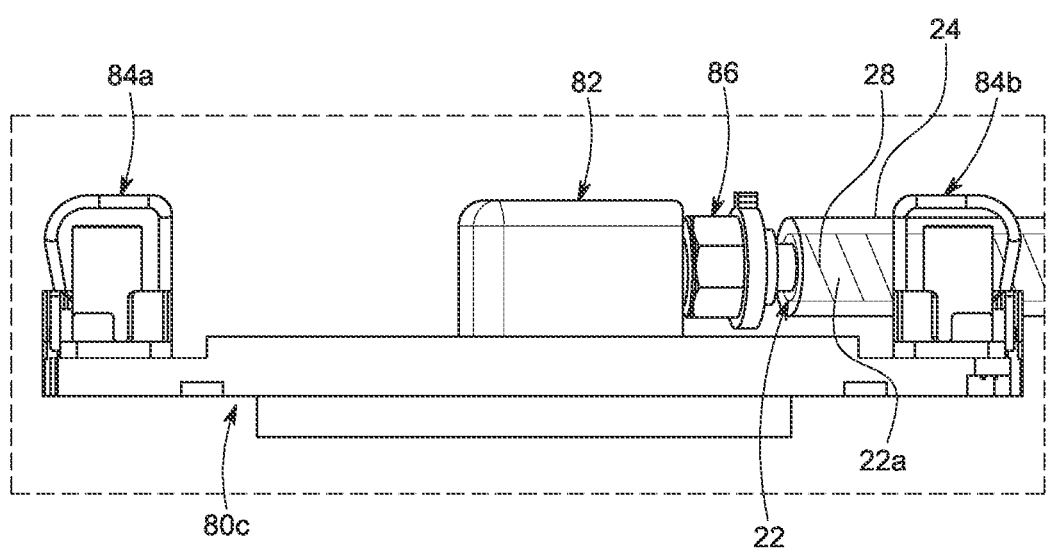
FIG. 6 is a front view of a portion of the liquid coolant conduit and a cold plate according to one embodiment.

Referring to FIG. 6, a liquid detect sensor 28 is shown between the inner portion 22 and the outer portion 24. The liquid detect sensor 28 is configured to detect any of the liquid coolant 90 that escapes from the liquid coolant conduit 20 and, more specifically, from the inner portion 22. In one embodiment, the liquid detect sensor 28 is wrapped around the exterior surface 22a of the inner portion 22. It is contemplated that the liquid detect sensor may be located differently than shown in FIG. 6.

Figure 7A:
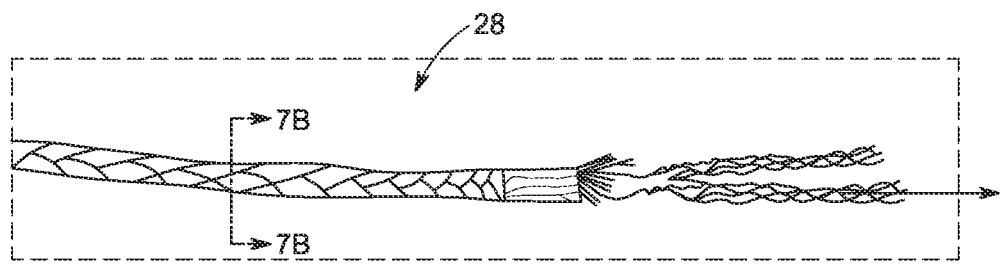
FIG. 7A is a top view of a liquid detect sensor according to one embodiment.
Figure 7B:
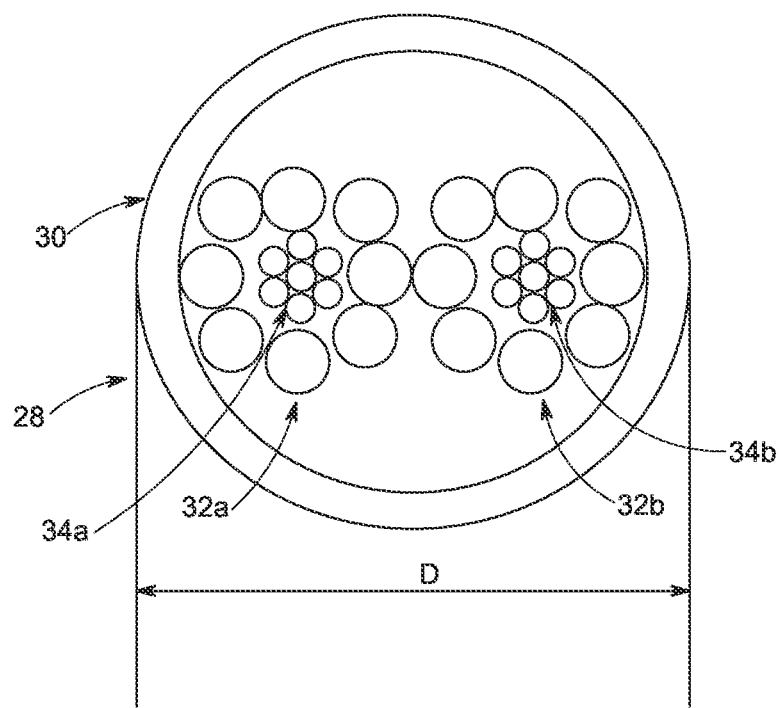
FIG. 7B is a cross-sectional view of the liquid detect sensor of FIG. 7A taken generally along line 7B-7B.

As shown in FIGS. 7A, 7B, the liquid detect sensor 28 is braided in one embodiment. Referring specifically to FIG. 7B, the liquid detect sensor includes an external braided component 30 and a plurality of internal braided components 32a, 32b. Each of the internal braided components 32a, 32b includes a respective electrode 34a, 34b therein. The electrodes 34a, 34b assist in detecting any of the liquid coolant 90 that has absorbed or passed through the external braided component 30 and the plurality of internal braided components 32a, 32b.

In one non-limiting technique for detecting coolant, a leakage detect sensor has consistent resistance in a fixed length. When a coolant drop on leakage is detected on the liquid detect sensor, the resistance will be changed. A comparator circuit, for example, may be used to compare and identify whether the resistance of the liquid detect sensor has been changed or not. If the resistance has been changed, it means there is leakage of the coolant.

In one method, any of the liquid coolant that contacts the liquid detect sensor 28 will result in an alert being sent to a user. In another method, if any of the liquid coolant 90 contacts the liquid detect sensor 28, a shutdown may occur.

The liquid detect sensor 28 is shown in a generally circular shape in FIG. 7B. It is contemplated that the shape of the liquid detect sensor may vary from that shown in FIG. 7B. A diameter D of the liquid detect sensor 28 in FIG. 7B is from about 2.5 to about 3.5 mm in one embodiment. It is also contemplated that the size of the diameter D may be different that depicted in FIG. 7B.

The liquid coolant 90 may be selected from a variety of coolants to assist in removing heat generated from the plurality of heat-generating electrical components 40. In one embodiment, the liquid coolant 90 is a thermally-conductive, dielectric liquid coolant. The liquid coolant 90 assists in removing heat generated from the heat-generated electrical components 40. Non-limiting examples of coolants include fluorocarbons, water (e.g., deionized water, mixtures including water) and hydrocarbons. It is contemplated that other coolants may be used that can remove and absorb heat from the plurality of heat-generating electrical components.

Referring back to FIG. 6, the cold plate 80c is shown that is adapted to be fastened on the plurality of heat-generating electrical components 40 (see FIG. 1). The cold plate 80c is coupled to the liquid coolant conduit 20 (see FIG. 1) via a right angle connector 82. A plurality of fastening nuts 84a, 84b is configured to fasten to one of the plurality of heat-generating electrical components 40. In one embodiment, the liquid coolant conduit is coupled to the cold plate. This could be a mechanical or a thermal coupling. The cold plate 80c is typically made of metal to allow heat transfer between one of the plurality of heat-generating electrical components 40 and the liquid coolant 90 in the liquid coolant conduit 20. The right angle connector 82 and the liquid coolant conduit 20 are connected using a hex nut 86.

Figure 8:
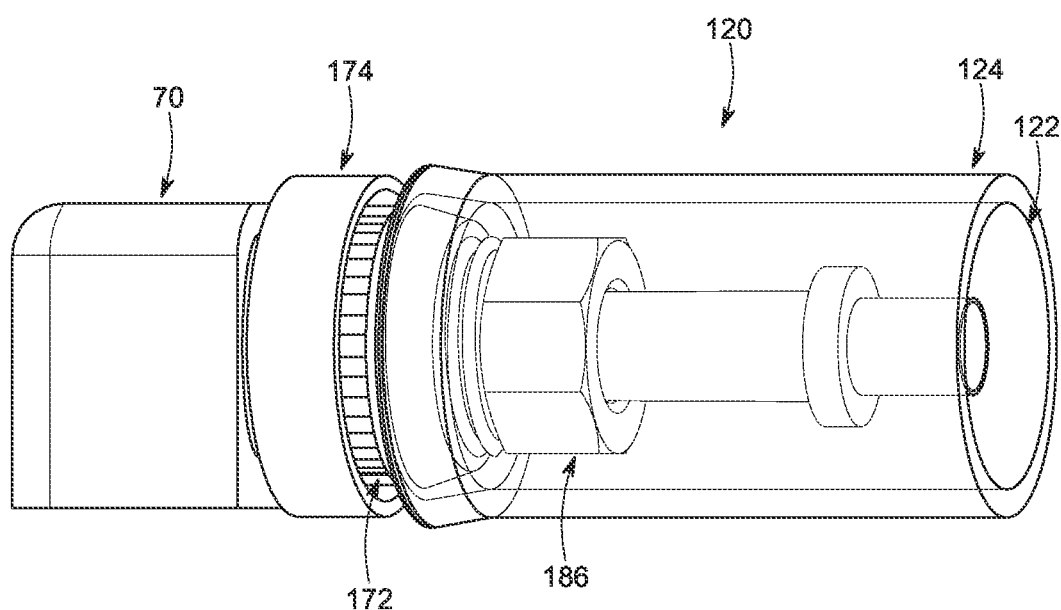
FIG. 8 is a front view of the rack manifold of FIG. 4 and a portion of the liquid coolant conduit extending therefrom in accordance with another embodiment.

It is contemplated that the liquid coolant conduit may be shaped and sized differently than shown above. For example, referring to FIG. 8, a connection between a rack manifold 70 and a liquid coolant conduit 120 is shown. The rack manifold 70 is connected to the liquid coolant conduit 120 via a connector 172 and a clamp 174. The clamp 174 assists in maintaining the positioning of the rack manifold 70 and the liquid coolant conduit 120. The liquid coolant conduit 120 covers a hex nut 186 in this embodiment. The liquid coolant conduit 120 has an inner portion 122 and an outer portion 124. The inner and outer portions 122, 124 function the same as described above in FIGS. 5A, 5B with respect to the inner and outer portions 22, 24, respectively. The only difference is the sizing of the inner and outer portions 122, 124. A liquid detect sensor (not shown) in this embodiment would be the same as the above described liquid detect sensor 28 in FIG. 6. In this embodiment, the liquid detect sensor may be wrapped around an inner portion such as shown with the liquid detect sensor 28 above. This embodiment can potentially provide additional leak prevention by further surrounding connections during the path of the liquid coolant.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure.

Thus, the breadth and scope of the present disclosure should not be limited by any of the above described embodiments. Rather, the scope of the disclosure should be defined in accordance with the following claims and their equivalents.

What is claimed is:

1. A closed-loop liquid cooling system comprising:
a liquid coolant conduit in proximity to a heat-generating electrical component, the liquid coolant conduit allowing circulation of a liquid coolant to extract heat from the heat-generating electrical component, the liquid coolant conduit including an inner portion that surrounds and contains the liquid coolant, the liquid coolant including an outer portion configured to prevent or inhibit leakage of the liquid coolant from the inner portion and also detect any leakage from the inner portion, the outer portion of the liquid coolant conduit including a liquid detect sensor and a leakage/spray prevention shell;
at least one cold plate in thermal communication with the liquid coolant;
at least one pump configured to transport the liquid coolant in the liquid coolant conduit; and
at least one heat exchanger coupled to the liquid coolant conduit to extract heat therefrom,
wherein the inner portion of the liquid coolant conduit is a metal tube,
wherein the leakage/spray prevention shell includes polyvinyl chloride (PVC), polyethylene terephthalate (PET), ethylene propylene diene monomer (EPDM), or any combination thereof,
wherein the liquid detect sensor includes an external braided component and a plurality of internal braided components, each of the plurality of internal braided components includes and surrounds an electrode located therein.

2. The closed-loop liquid cooling system of claim 1, wherein the at least one cold plate is a plurality of cold plates.

3. The closed-loop liquid cooling system of claim 1, wherein the liquid detect sensor is located between the inner portion and the leakage/spray prevention shell.

4. The closed-loop liquid cooling system of claim 1, wherein the liquid detect sensor is braided.

5. The closed-loop liquid cooling system of claim 1, further including a rack manifold to assist in distributing the liquid coolant.

6. The closed-loop liquid cooling system of claim 1, wherein the at least one pump and the at least one heat exchanger are located within a coolant distribution unit.

7. The closed-loop liquid cooling system of claim 6, wherein the coolant distribution unit further includes an air flow system operable to propel ambient air through the at least one heat exchanger.

8. The closed-loop liquid cooling system of claim 1, wherein the liquid coolant conduit is coupled to the at least one cold plate.

9. The closed-loop liquid cooling system of claim 1 further including the liquid coolant.

10. The computer system comprising:
a plurality of heat-generating electrical components;
a liquid coolant conduit in proximity to the plurality of heat-generating electrical components allowing circulation of a liquid coolant to extract heat from the plurality of heat-generating electrical components, the liquid coolant conduit including an inner portion that surrounds and contains the liquid coolant, the inner portion being a tube or a shell, and an outer portion configured to prevent or inhibit leakage of the liquid coolant from the inner portion and also to detect any leakage from the inner portion, the outer portion of the liquid coolant conduit including a liquid detect sensor and a leakage/spray prevention shell;
at least one cold plate in thermal communication with the liquid coolant;
at least one pump configured to transport the liquid coolant in the liquid coolant conduit; and
at least one heat exchanger coupled to the liquid coolant conduit to extract heat therefrom,
wherein the inner portion of the liquid coolant conduit is a metal tube,
wherein the leakage/spray prevention shell includes polyvinyl chloride (PVC), polyethylene terephthalate (PET), ethylene propylene diene monomer (EPDM), or any combination thereof,
wherein the liquid detect sensor includes an external braided component and a plurality of internal braided components, each of the plurality of internal braided components includes and surrounds an electrode located therein.

11. The computer system of claim 10, wherein the plurality of heat-generating electrical components is a plurality of servers.

12. The computer system of claim 10, wherein the inner portion of the liquid coolant conduit is a metal tube.

13. The computer system of claim 10, wherein the liquid detect sensor is located between the inner portion and the leakage/spray prevention shell.

14. The computer system of claim 10, further including a rack manifold to assist in distributing the liquid coolant.

* * * * *